United States Patent
Pan et al.

(10) Patent No.: US 8,488,279 B1
(45) Date of Patent: Jul. 16, 2013

(54) DISK DRIVE SUSPENSION ASSEMBLY WITH FLEXURE HAVING STACKED INTERLEAVED TRACES

(75) Inventors: Tzong-Shii Pan, San Jose, CA (US); Cliff Zhang, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 8 days.

(21) Appl. No.: 13/302,979

(22) Filed: Nov. 22, 2011

(51) Int. Cl.
G11B 5/48 (2006.01)

(52) U.S. Cl.
USPC ........................................ 360/245.9

(58) Field of Classification Search
USPC .................. 174/115; 360/245.8, 245.9
See application file for complete search history.

(56) References Cited

U.S. PATENT DOCUMENTS

| | | | | |
|---|---|---|---|---|
| 4,819,094 | A * | 4/1989 | Oberg | 360/245.9 |
| 4,845,311 | A * | 7/1989 | Schreiber et al. | 174/36 |
| 5,737,152 | A * | 4/1998 | Balakrishnan | 360/245.9 |
| 5,754,369 | A * | 5/1998 | Balakrishnan | 360/264.2 |
| 5,805,382 | A | 9/1998 | Lee et al. | |
| 5,812,344 | A * | 9/1998 | Balakrishnan | 360/245.9 |
| 5,862,010 | A * | 1/1999 | Simmons et al. | 360/99.15 |
| 5,995,328 | A * | 11/1999 | Balakrishnan | 360/245.9 |
| 6,038,102 | A * | 3/2000 | Balakrishnan et al. | 360/264.2 |
| 6,219,202 | B1 * | 4/2001 | Palmer | 360/234.5 |
| 6,249,404 | B1 * | 6/2001 | Doundakov et al. | 360/265.4 |
| 6,369,987 | B1 * | 4/2002 | Khan et al. | 360/245.9 |
| 6,414,820 | B1 * | 7/2002 | Coon et al. | 360/245.9 |
| 6,487,048 | B1 * | 11/2002 | Dunn | 360/245.9 |
| 6,608,736 | B1 | 8/2003 | Klaassen et al. | |
| 6,700,748 | B1 | 3/2004 | Cowles et al. | |
| 6,900,967 | B1 | 5/2005 | Coon et al. | |
| 6,975,488 | B1 | 12/2005 | Kulangara et al. | |
| 7,286,325 | B2 * | 10/2007 | Hernandez et al. | 360/234.5 |
| 7,325,294 | B2 | 2/2008 | Zhou | |
| 7,595,963 | B1 * | 9/2009 | Chen et al. | 360/245.9 |
| 7,832,082 | B1 | 11/2010 | Hentges et al. | |
| 7,986,494 | B2 * | 7/2011 | Pro | 360/245.9 |
| 8,094,413 | B1 * | 1/2012 | Hentges et al. | 360/245.9 |
| 8,111,483 | B2 * | 2/2012 | Arai | 360/245.9 |
| 8,154,827 | B2 * | 4/2012 | Contreras et al. | 360/264.2 |
| 8,169,746 | B1 * | 5/2012 | Rice et al. | 360/245.9 |
| 8,233,240 | B2 * | 7/2012 | Contreras et al. | 360/245.9 |
| 2004/0252413 | A1 | 12/2004 | Nishiyama | |
| 2006/0044695 | A1 | 3/2006 | Erpelding | |
| 2006/0173343 | A1 * | 8/2006 | Guo et al. | 600/459 |
| 2011/0019311 | A1 * | 1/2011 | Greminger et al. | 360/234.5 |
| 2011/0157750 | A1 * | 6/2011 | Zhu et al. | 360/245.8 |
| 2012/0160538 | A1 * | 6/2012 | Contreras et al. | 174/115 |
| 2012/0160548 | A1 * | 6/2012 | Contreras et al. | 174/257 |

* cited by examiner

Primary Examiner — Brian Miller

(57) ABSTRACT

A disk drive suspension assembly has a laminated flexure that includes a structural layer, first and second conductive layers, a first dielectric layer disposed between the structural layer and the first conductive layer, and a second dielectric layer disposed between the first conductive layer and the second conductive layer. The first conductive layer includes at least a first conductive trace and a second conductive trace, and the second conductive layer includes at least a third conductive trace and a fourth conductive trace. The first conductive trace is electrically connected to the fourth conductive trace by a first conductive via through the second dielectric layer, and the second conductive trace is electrically connected to the third conductive trace through a second conductive via through the second dielectric layer. The third conductive trace overlies the first conductive trace, and the fourth conductive trace overlies the second conductive trace.

20 Claims, 6 Drawing Sheets

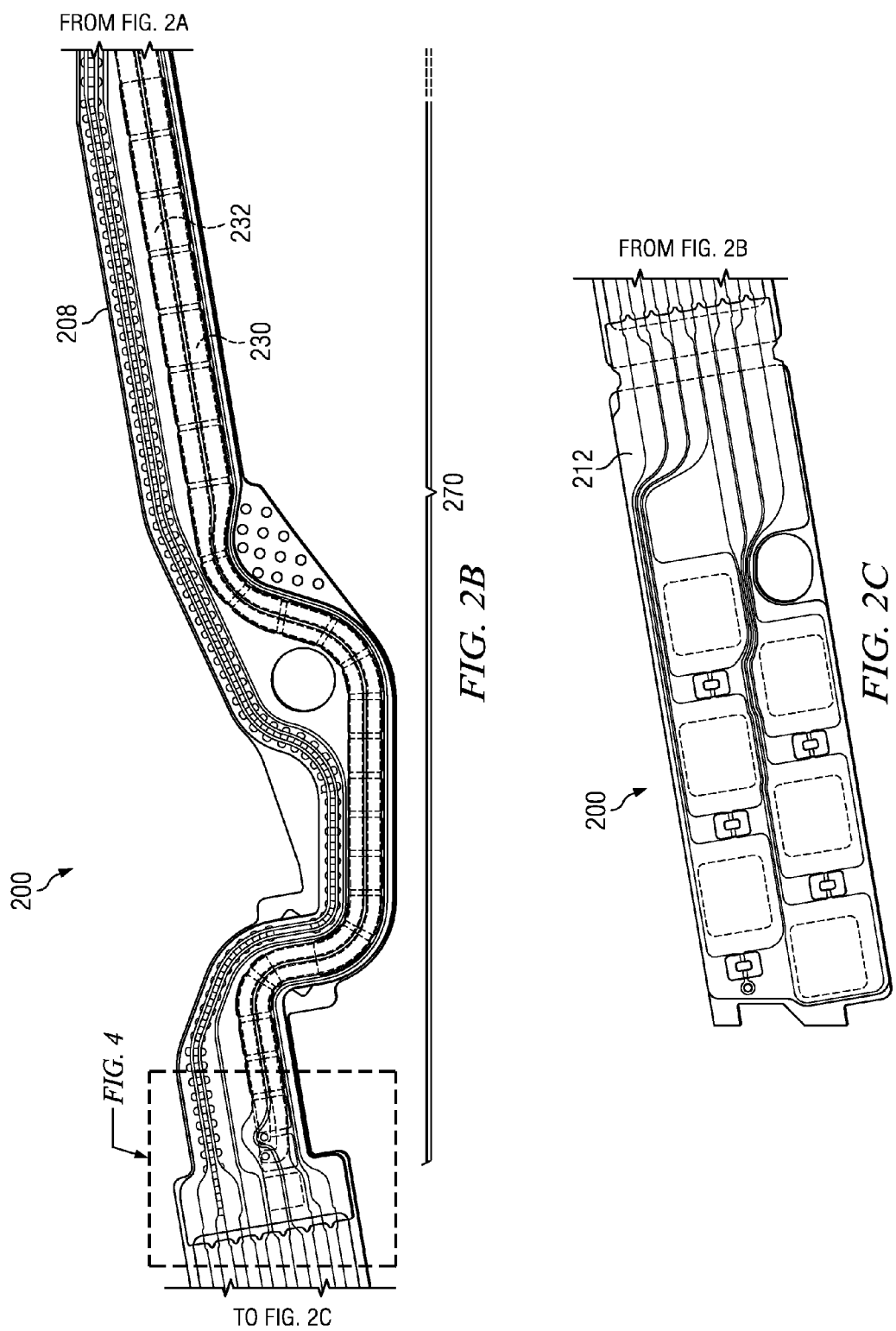

DISK DRIVE SUSPENSION ASSEMBLY WITH FLEXURE HAVING STACKED INTERLEAVED TRACES

BACKGROUND

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write.

In a modern magnetic hard disk drive device, each head is a sub-component of a head gimbal assembly (HGA) that typically includes a suspension assembly with a laminated flexure to carry the electrical signals to and from the head. The HGA, in turn, is a sub-component of a head stack assembly (HSA) that typically includes a plurality of HGAs, an actuator, and a flexible printed circuit. The plurality of HGAs are attached to various arms of the actuator, and each of the laminated flexures of the HGAs has a flexure tail that is electrically connected to the HSA's flexible printed circuit.

Modern laminated flexures typically include conductive copper traces that are isolated from a stainless steel structural layer by a polyimide dielectric layer. So that the signals from/to the head can reach the flex cable on the actuator body, each HGA flexure includes a flexure tail that extends away from the head along the actuator arm and ultimately attaches to the flexible printed circuit adjacent the actuator body. That is, the flexure includes traces that extend from adjacent the head and terminate at electrical connection points at the flexible printed circuit. The flexible printed circuit includes electrical conduits that correspond to the electrical connection points of the flexure tail.

Since the conductive traces of the flexure are separated from the structural layer by a dielectric layer, electrical capacitance exists between the conductive traces and the structural layer. Electrical capacitance also exists between one conductive trace and another adjacent conductive trace. Such electrical capacitances affect the capacitive reactance and impedance of the conductive traces. The capacitance between adjacent conductive traces in conventional flexures is substantially governed by the edge thickness of the traces and the spacing between the edges of the adjacent conductive traces. However, the design range for edge thickness of the traces is very limited by other design and fabrication considerations, and therefore the design range of capacitance between adjacent conductive traces may not be as large as desired. Moreover, stray fields may induce noise in the conductive traces. Hence, there is a need in the art for a flexure design that provides a broader design range for inter-trace capacitance and/or capacitance between the traces and structural layer, and/or can reduce noise induced by stray fields.

BRIEF DESCRIPTION OF DRAWINGS

FIGS. 2A, 2B, and 2C depict a suspension assembly according to an embodiment of the present invention, with dashed rectangles indicating locations of close-up views in FIG. 3 and FIG. 4.

DETAILED DESCRIPTION OF EXAMPLE EMBODIMENTS

Figure 1:
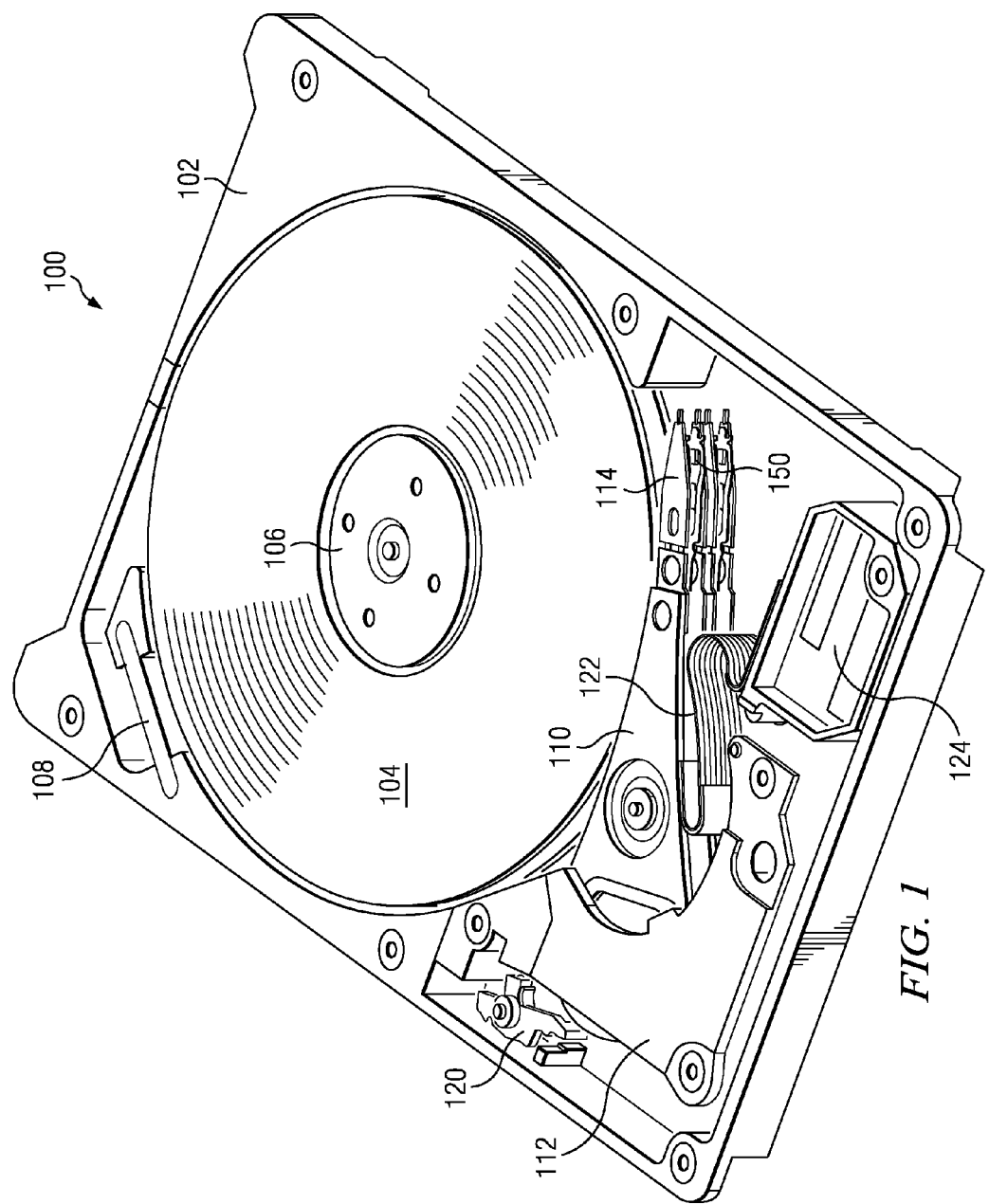
FIG. 1 is a top perspective view of a disk drive capable of including an embodiment of the present invention.

FIG. 1 is a top perspective view of a disk drive 100 capable of including an embodiment of the present invention. The disk drive 100 includes a disk drive base 102 and two annular magnetic disks 104. The disk drive 100 further includes a spindle 106, rotably mounted on the disk drive base 102, for rotating the disks 104. The rotation of the disks 104 establishes air flow through recirculation filter 108. In other embodiments, disk drive 100 may have only a single disk, or alternatively, more than two disks.

The disk drive 100 further includes an actuator 110 that is rotably mounted on disk drive base 102. Voice coil motor 112 rotates the actuator 110 through a limited angular range so that at least one head gimbal assembly (HGA) 114 is desirably positioned relative to one or more tracks of information on a corresponding one of the disks 104. The embodiment of FIG. 1 includes four HGAs 114, each of which corresponds to a surface of one of the two disks 104. However, in other embodiments fewer or more HGAs may be included depending on the number of disks 114 that are included and whether the disk drive 100 is depopulated. Each HGA 114 includes a head 150 for reading and writing data from and to one of the disks 114. The actuator 110 may occasionally be latched at an extreme angular position within the limited angular range, by latch 120. Electrical signals to/from the HGAs 114 are carried to other drive electronics via a flex cable 122 and flex cable bracket 124.

Figure 2A:
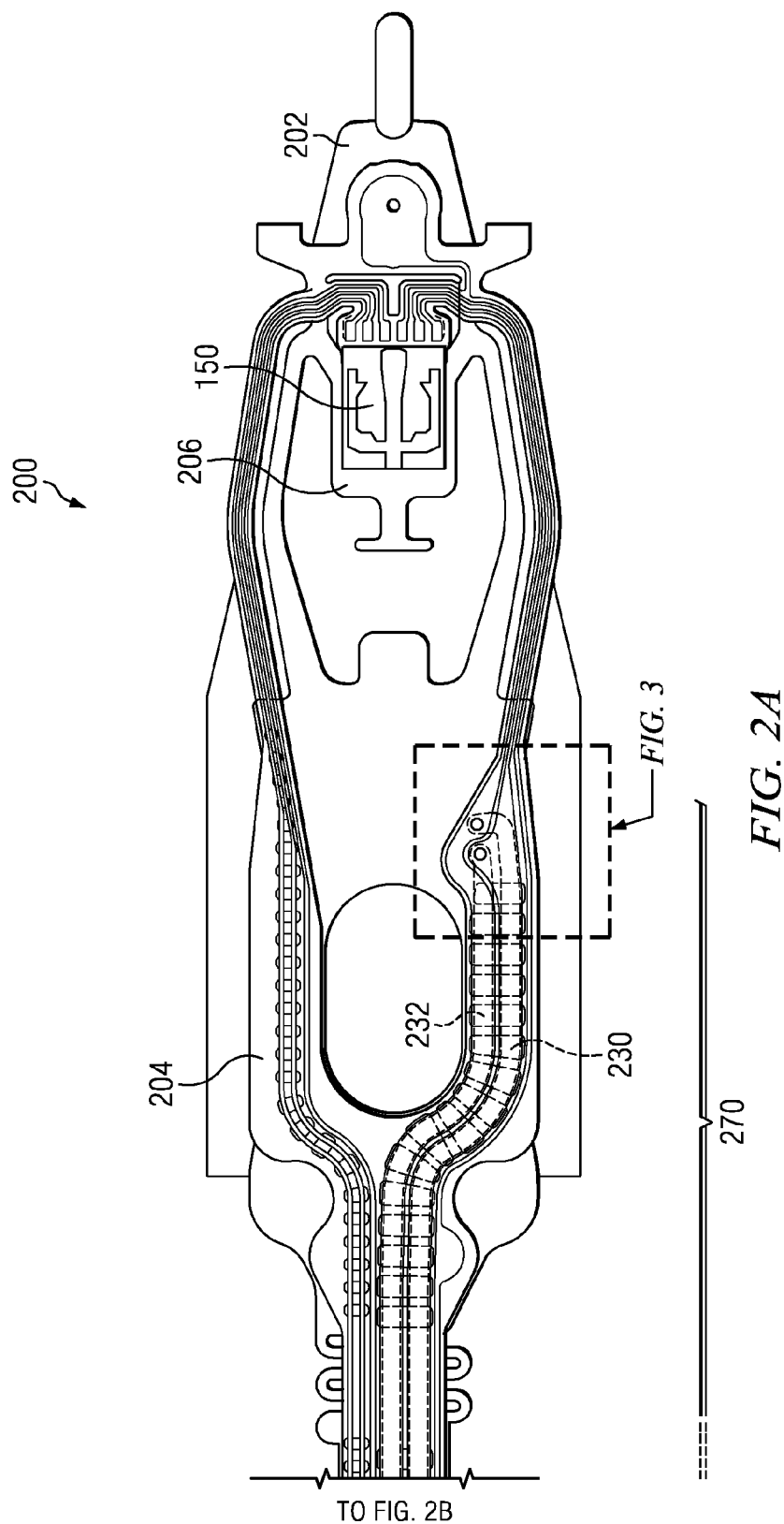
Figure 3:
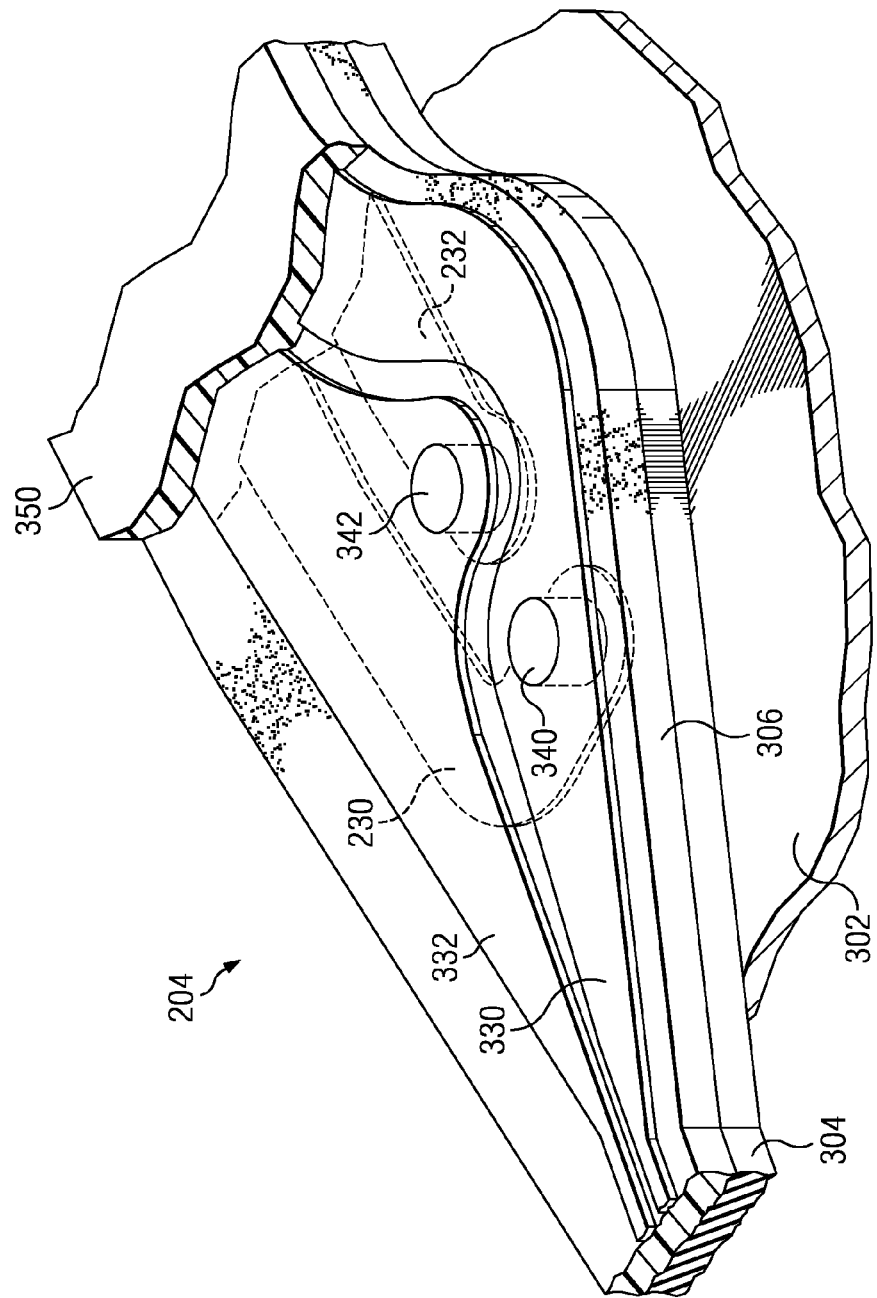
FIG. 3 is a close-up cutaway perspective view of a portion of a laminated flexure according to an embodiment of the present invention, at the location indicated in FIG. 2A.
Figure 4:
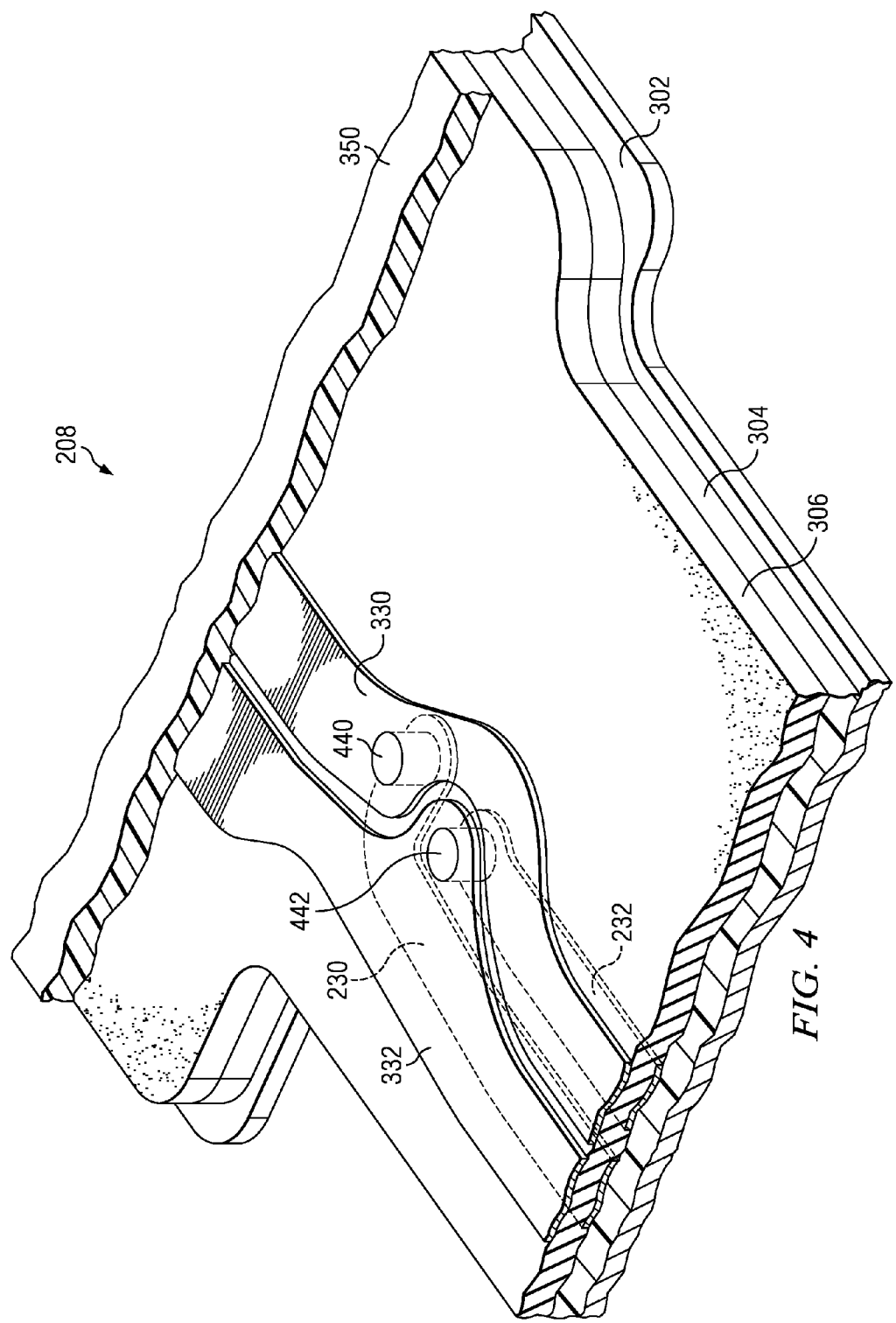
FIG. 4 is a close-up cutaway perspective view of a portion of a laminated flexure according to an embodiment of the present invention, at the location indicated in FIG. 2B.

FIGS. 2A, 2B, and 2C depict a suspension assembly 200 according to an embodiment of the present invention, with dashed rectangles indicating locations of close-up views in FIG. 3 and FIG. 4. The suspension assembly 200 is designed to support a head 150 after it is assembled into a HGA. However, before assembly into an HGA, the suspension assembly 200 does not include a head, and suspension assemblies may be manufactured and sold without including a head. The suspension assembly 200 includes a load beam 202. A purpose of the load beam 202, once the suspension assembly 200 is included in a HGA, is to provide vertical compliance for the head 150 to follow vertical undulation of the surface of the disk 104 as it rotates, and to preload the head 150 against the surface of the disk 104 as it rotates, by a preload force that is commonly referred to as the "gram load."

The suspension assembly 200 also includes a laminated flexure 204 attached to the load beam 202. For example, a structural layer of the laminated flexure 204 may be spot welded to the load beam 202. When the suspension assembly 200 is included in a HGA, the head 150 is attached to a head mounting surface of a tongue 206 of the laminated flexure 204. A first purpose of the laminated flexure 204 is to provide compliance for the head 150 to follow pitch and roll angular undulations of the surface of disk as it rotates, while restricting relative motion between the head 150 and the load beam 202 in the lateral direction and about a yaw axis. A second purpose of the laminated flexure 204 is to provide a plurality of electrical paths to the head to facilitate signal transmission to/from the head 150.

For that second purpose, the laminated flexure 204 includes a plurality of electrically conductive traces (including a subset of electrically conductive traces 230, 232). Each of the electrically conductive traces 230, 232 may comprise copper, and be laterally spaced from the other by a lateral spacing in the range of 10 microns to 30 microns, for example. Furthermore, the plurality of electrically conductive traces of the laminated flexure 204 may include many electrically conductive traces in addition to electrically conductive traces 230, 232. For example, at least two electrically conductive traces may be electrically coupled to a write transducer of the head 150 and two electrically conductive traces may be electrically coupled to a read transducer of the head 150. Additionally, there may be additional electrically conductive traces coupled to other structures or devices of head 150 such as a micro-actuator, a transducer heater, a touch-down sensor, a laser diode, etc.

So that the signals from/to the head 150 can reach the flex cable 122 adjacent the actuator 110, the laminated flexure 204 of FIGS. 2A, 2B, and 2C includes a flexure tail 208 that extends away from the head 150 along the actuator 110 and ultimately connects to the flex cable 122 adjacent the actuator 110. That is, the laminated flexure 204 includes conductive traces (including the subset of electrically conductive traces 230, 232) that extend from adjacent the head 150 and terminate at electrical connection points at a terminus region 212 of the flexure tail 208. As seen from FIGS. 1, 2A, 2B, and 2C, the flexure tail 208 is a distinct and smaller component, as compared with flex cable 122. Methods of electrical connection of the flexure tail 208 to the flex cable 122 include ultrasonic tab bonding, solder reflow, anisotropic conductive film bonding, or solder jet bond (SJB).

FIG. 3 is a close-up cutaway perspective view of a portion of the laminated flexure 204, at the location indicated in FIG. 2A. Now referring additionally to FIG. 3, the laminated flexure 204 includes a structural layer 302, which may comprise stainless steel and have a thickness in the range of 10 microns to 20 microns, for example. The laminated flexure 204 also includes conductive traces 230, 232, which are a subset of electrically conductive traces that pertain to a first conductive layer. Although there could be more electrically conductive traces patterned in the first conductive layer, only the subset 230, 232 is shown in FIG. 3, so that each such electrically conductive trace of that subset can be shown more clearly.

The laminated flexure 204 also includes conductive traces 330, 332, which are a subset of electrically conductive traces that pertain to a second conductive layer. Although there could be more electrically conductive traces patterned in the second conductive layer, only the subset 330, 332 is shown in FIG. 3, so that each such electrically conductive trace of that subset can be shown more clearly. The first and second conductive layers may comprise copper and have a thickness in the range of 5 microns to 15 microns, for example.

In the embodiment of FIG. 3, the laminated flexure 204 also includes a first dielectric layer 304 disposed between the structural layer 302 and the first conductive layer that includes conductive traces 230, 232. The laminated flexure 204 also includes a second dielectric layer 306 disposed between the first conductive layer that includes conductive traces 230, 232 and the second conductive layer that includes conductive traces 330, 332. The first and second dielectric layers 304, 306 may each comprise polyimide and have a thickness in the range of 4 microns to 20 microns, for example.

In the embodiment of FIG. 3, the conductive trace 230 of the first conductive layer is electrically connected to the conductive trace 330 of the second conductive layer, by a conductive via 340 through the second dielectric layer 306. Likewise, the conductive trace 232 of the first conductive layer is electrically connected to the conductive trace 332 of the second conductive layer, by a conductive via 342 through the second dielectric layer 306. The conductive vias 340, 342 may comprise a conductive metal such as copper or gold, for example.

In the example of FIG. 3, it can be seen (in the upper right region of the figure) that the conductive trace 330 overlies the conductive trace 232, and the conductive trace 332 overlies the conductive trace 230. Overlying in this context does not imply direct contact, but rather that the largest major surface of an upper trace (e.g. trace 330 of the second conductive layer) overlaps with the largest major surface of a lower trace (e.g. 232 of the first conductive layer), while being electrically separated by the second dielectric layer 306. Also, in the example of FIG. 3, an optional insulative cover layer 350 may cover the upper traces 330, 332 of the second conductive layer.

FIG. 4 is a close-up cutaway perspective view of a portion of the flexure tail 208 of the laminated flexure 204, at the location indicated in FIG. 2B. Now referring additionally to FIG. 4, the conductive trace 230 of the first conductive layer is electrically connected to the conductive trace 330 of the second conductive layer, by a conductive via 440 through the second dielectric layer 306. Likewise, the conductive trace 232 of the first conductive layer is electrically connected to the conductive trace 332 of the second conductive layer, by a conductive via 442 through the second dielectric layer 306. Although there could be additional and more numerous electrically conductive traces patterned in the first and second conductive layers, only electrically conductive traces 230, 232, 330, 332 are shown in FIG. 4, so that each of those electrically conductive traces can be shown more clearly. The conductive vias 440, 442 may comprise a conductive metal such as copper or gold, for example.

In the example of FIGS. 2A-C, 3, and 4, it can be seen that the conductive trace 330 overlies the conductive trace 232, and the conductive trace 332 overlies the conductive trace 230, in an overlap region 270 that lies between the conductive vias 340 and 440, and that lies between the conductive vias 342 and 442. It can also be seen from FIGS. 2A-C, 3, and 4 that the conductive vias 340, 342 are disposed closer to the tongue 206 than to the flexure tail terminus region 212, and conductive vias 440, 442 are disposed closer to the flexure tail terminus region 212 than to the tongue 206. It can be seen that the conductive trace 330 overlies the conductive trace 232, and the conductive trace 332 overlies the conductive trace 230, in the upper right region of FIG. 3, and in the lower left region of FIG. 4, for example.

Figure 5:
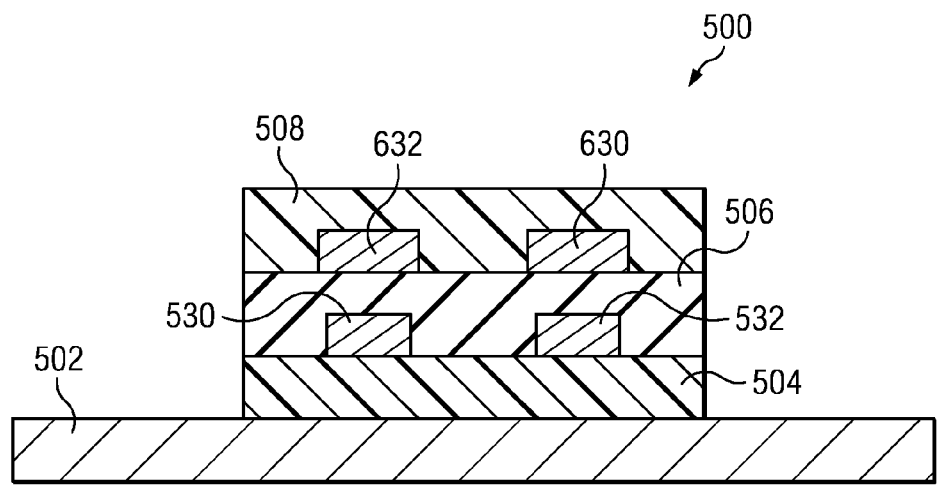
FIG. 5 is a cross-sectional view of a laminated flexure, according to an embodiment of the present invention.

FIG. 5 is a cross-sectional view of a portion of a laminated flexure 500, according to an embodiment of the present invention. The laminated flexure 500 includes a structural layer 502 and conductive traces 530, 532, which are a subset of electrically conductive traces that pertain to a first conductive layer. The laminated flexure also includes conductive traces 630, 632, which are a subset of electrically conductive traces that pertain to a second conductive layer. The first and second conductive layers may each include additional and more numerous electrically conductive traces.

In the embodiment of FIG. 5, the laminated flexure 500 also includes a first dielectric layer 504 disposed between the structural layer 502 and the first conductive layer that includes conductive traces 530, 532. The laminated flexure 500 also includes a second dielectric layer 506 disposed between the first conductive layer that includes conductive traces 530, 532 and the second conductive layer that includes conductive traces 630, 632. Also, in the example of FIG. 5, an optional insulative cover layer 508 may cover the upper traces 630, 632 of the second conductive layer.

In the embodiment of FIG. 5, the conductive trace 530 of the first conductive layer is electrically connected to the conductive trace 630 of the second conductive layer, by a conductive via (not shown) through the second dielectric layer 506. Likewise, the conductive trace 532 of the first conductive layer is electrically connected to the conductive trace 632 of the second conductive layer, by a conductive via (not shown) through the second dielectric layer 506.

In the example of FIG. 5, it can be seen that the conductive trace 630 overlies the conductive trace 532, and the conductive trace 632 overlies the conductive trace 530. Overlying in this context does not imply direct contact, but rather that the largest major surface of an upper trace (e.g. trace 630 of the second conductive layer) overlaps with the largest major surface of a lower trace (e.g. 532 of the first conductive layer), while being electrically separated by the second dielectric layer 506. Such overlap does not need to be complete overlap for all traces. For example although in FIG. 4 the widths of the interleaved traces 230, 232, 330, 332 are shown to be equal, they need not be. In certain embodiments, unequal widths may be preferred. For example, in FIGS. 5 and 6, the traces 630, and 632 are shown to be wider than the traces 530, and 532. In certain embodiments, such a trace width inequality may increase the likelihood of capacitive balancing and common mode rejection of noise, despite manufacturing variation in the relative positions of conductive traces.

In this regard, the conductive trace arrangement shown in FIG. 5 is considered to be an "interleaved" conductive trace arrangement, since conductive traces 530 and 630 may carry the same first signal as a first common conductor, and conductive traces 532 and 632 may carry the same second signal as a second common conductor, with individual traces of the first conductor being interleaved (as shown in FIG. 5) with the individual traces of the second conductor. Such an interleaved arrangement may provide substantial advantages in terms of electrical properties, such as balancing the capacitance of each trace with respect to the structural layer 502, changing inter-trace capacitance, increasing bandwidth, and electromagnetic noise shielding and common mode rejection or cancellation.

Figure 6:
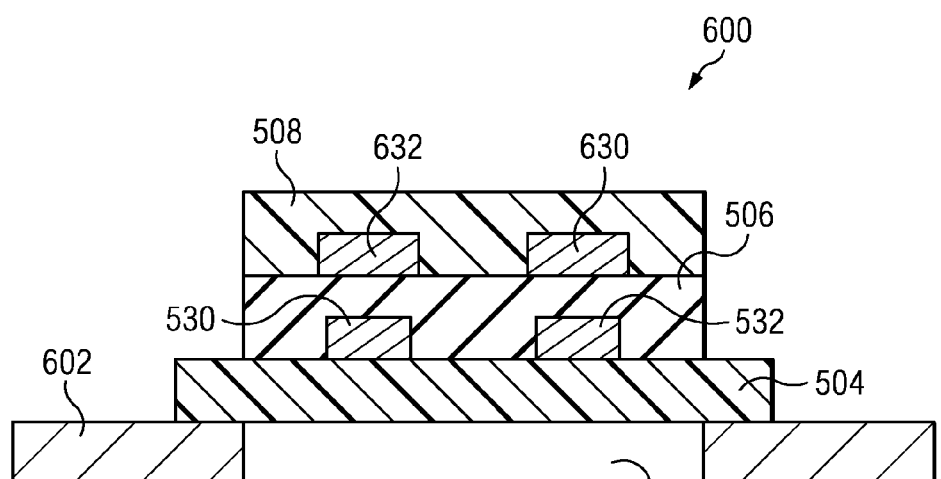
FIG. 6 is a cross-sectional view of a laminated flexure, according to another embodiment of the present invention.

FIG. 6 is a cross-sectional view of a laminated flexure 600, according to another embodiment of the present invention. In the interests of brevity, since the laminated flexure 600 has a similar interleaved conductive trace arrangement as the laminated flexure 500 (of the embodiment of FIG. 5), like numerical labels are repeated in FIG. 6 for like structures, without repeating the description of such like structures here. The only substantial difference between the embodiment of FIG. 5 and the embodiment of FIG. 6, is that the structural layer 602 of the laminated flexure 600 of FIG. 6 includes an optional plurality of apertures (e.g. aperture 650 at the location of cross-section) The optional apertures in the structural layer 602 (e.g. aperture 650) underlie the conductive traces 530 and 532, for example to beneficially reduce or adjust the capacitance between the structural layer 602 and either or both of the conductive traces 530 and 532.

In the foregoing specification, the invention is described with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. For example, the word "preferably," and the phrase "preferably but not necessarily," are used synonymously herein to consistently include the meaning of "not necessarily" or optionally. "Comprising," "including," and "having," are intended to be open-ended terms.

What is claimed is:

1. A suspension assembly comprising:
   a load beam;
   a laminated flexure attached to the load beam, the laminated flexure including:
   a structural layer;
   a first conductive layer and a second conductive layer;
   a first dielectric layer disposed between the structural layer and the first conductive layer; and
   a second dielectric layer disposed between the first conductive layer and the second conductive layer;
   wherein the first conductive layer includes at least a first conductive trace and a second conductive trace, and the second conductive layer includes at least a third conductive trace and a fourth conductive trace;
   wherein the first conductive trace is electrically connected to the fourth conductive trace by a first conductive via through the second dielectric layer, and the second conductive trace is electrically connected to the third conductive trace through a second conductive via through the second dielectric layer; and
   wherein the third conductive trace overlies the first conductive trace, and the fourth conductive trace overlies the second conductive trace.

2. The suspension assembly of claim 1 wherein each of the first and second dielectric layers comprises polyimide and has a thickness in the range of 4 microns to 20 microns.

3. The suspension assembly of claim 1 wherein the structural layer comprises stainless steel and has a thickness in the range of 10 microns to 20 microns.

4. The suspension assembly of claim 1 wherein each of the first and second conductive layers comprises copper and has a thickness in the range of 5 microns to 15 microns.

5. The suspension assembly of claim 1 further comprising a plurality of apertures in the structural layer, each of the plurality of apertures underlying the first trace and the second trace.

6. The suspension assembly of claim 1 further comprising a third dielectric layer overlying the second conductive layer.

7. The suspension assembly of claim 1 wherein the first conductive trace is further electrically connected to the fourth conductive trace by a third conductive via through the second dielectric layer, and the second conductive trace is further electrically connected to the third conductive trace through a fourth conductive via through the second dielectric layer.

8. The suspension assembly of claim 7 wherein the third conductive trace overlies the first conductive trace, and the fourth conductive trace overlies the second conductive trace, in an overlap region that lies between the first and third conductive vias, and that lies between the second and fourth conductive vias.

9. The suspension assembly of claim 8 wherein the laminated flexure includes a tongue having a head mounting surface, and the laminated flexure includes an elongated flexure tail that extends away from the tongue to a tail terminus, and wherein the first and second conductive vias are disposed closer to the tongue than to the tail terminus, and the third and fourth conductive vias are disposed closer to the tail terminus than to the tongue.

10. The suspension assembly of claim 1 wherein the first conductive trace is laterally spaced from the second conductive trace by a lateral spacing in the range of 10 microns to 30 microns.

11. A head gimbal assembly (HGA) comprising:
a head; and
a suspension assembly comprising:
a load beam;
a laminated flexure attached to the load beam, the laminated flexure including:
a structural layer;
a first conductive layer and a second conductive layer;
a first dielectric layer disposed between the structural layer and the first conductive layer; and
a second dielectric layer disposed between the first conductive layer and the second conductive layer;
wherein the first conductive layer includes at least a first conductive trace and a second conductive trace, and the second conductive layer includes at least a third conductive trace and a fourth conductive trace;
wherein the first conductive trace is electrically connected to the fourth conductive trace by a first conductive via through the second dielectric layer, and the second conductive trace is electrically connected to the third conductive trace through a second conductive via through the second dielectric layer; and
wherein the third conductive trace overlies the first conductive trace, and the fourth conductive trace overlies the second conductive trace.

12. The HGA of claim 11 wherein the first and second conductive traces are electrically coupled to a write transducer of the head.

13. The HGA of claim 11 wherein the first conductive trace is further electrically connected to the fourth conductive trace by a third conductive via through the second dielectric layer, and the second conductive trace is further electrically connected to the third conductive trace through a fourth conductive via through the second dielectric layer.

14. The HGA of claim 13 wherein the third conductive trace overlies the first conductive trace, and the fourth conductive trace overlies the second conductive trace, in an overlap region that lies between the first and third conductive vias, and that lies between the second and fourth conductive vias.

15. The HGA of claim 14 wherein the laminated flexure includes a tongue to which the head is bonded, and the laminated flexure includes an elongated flexure tail that extends away from the tongue to a tail terminus, and wherein the first and second conductive vias are disposed closer to the tongue than to the tail terminus, and the third and fourth conductive vias are disposed closer to the tail terminus than to the tongue.

16. A disk drive comprising:
a disk drive base,
a spindle rotably attached to the disk drive base;
a disk mounted to the spindle,
a head stack assembly (HSA) pivotably attached to the disk drive base, the HSA including an actuator arm and a flexible printed circuit that includes a preamplifier chip; and
a head gimbal assembly (HGA) attached to the actuator arm, the HGA including a head; and
a suspension assembly comprising:
a load beam;
a laminated flexure attached to the load beam, the laminated flexure including:
a structural layer;
a first conductive layer and a second conductive layer;
a first dielectric layer disposed between the structural layer and the first conductive layer; and
a second dielectric layer disposed between the first conductive layer and the second conductive layer;
wherein the first conductive layer includes at least a first conductive trace and a second conductive trace, and the second conductive layer includes at least a third conductive trace and a fourth conductive trace;
wherein the first conductive trace is electrically connected to the fourth conductive trace by a first conductive via through the second dielectric layer, and the second conductive trace is electrically connected to the third conductive trace through a second conductive via through the second dielectric layer; and
wherein the third conductive trace overlies the first conductive trace, and the fourth conductive trace overlies the second conductive trace.

17. The disk drive of claim 16 wherein the first and second conductive traces are electrically coupled to a write transducer of the head.

18. The disk drive of claim 16 wherein the first conductive trace is further electrically connected to the fourth conductive trace by a third conductive via through the second dielectric layer, and the second conductive trace is further electrically connected to the third conductive trace through a fourth conductive via through the second dielectric layer.

19. The disk drive of claim 18 wherein the third conductive trace overlies the first conductive trace, and the fourth conductive trace overlies the second conductive trace, in an overlap region that lies between the first and third conductive vias, and that lies between the second and fourth conductive vias.

20. The disk drive of claim 19 wherein the laminated flexure includes a tongue to which the head is bonded, and the laminated flexure includes an elongated flexure tail that extends away from the tongue to a tail terminus that is attached to the flexible printed circuit, and wherein the first and second conductive vias are disposed closer to the tongue than to the tail terminus, and the third and fourth conductive vias are disposed closer to the tail terminus than to the tongue.

* * * * *